United States Patent
Turnbull

(10) Patent No.: US 9,954,518 B2
(45) Date of Patent: Apr. 24, 2018

(54) RESISTOR MULTIPLEXED SWITCH WAKE-UP CIRCUIT

(71) Applicant: Gentex Corporation, Zeeland, MI (US)

(72) Inventor: Robert R. Turnbull, Holland, MI (US)

(73) Assignee: GENTEX CORPORATION, Zeeland, MI (US)

( * ) Notice: Subject to any disclaimer, the term of this patent is extended or adjusted under 35 U.S.C. 154(b) by 0 days.

(21) Appl. No.: 15/046,982

(22) Filed: Feb. 18, 2016

(65) Prior Publication Data

US 2016/0248416 A1 Aug. 25, 2016

Related U.S. Application Data

(60) Provisional application No. 62/118,679, filed on Feb. 20, 2015.

(51) Int. Cl.
*H03K 17/12* (2006.01)
*H03K 17/22* (2006.01)
*H03K 17/60* (2006.01)

(52) U.S. Cl.
CPC ............. *H03K 17/12* (2013.01); *H03K 17/22* (2013.01); *H03K 17/223* (2013.01); *H03K 17/60* (2013.01)

(58) Field of Classification Search
CPC ...... H03K 17/12; H03K 17/22; H03K 17/223; H03K 17/60; G07C 9/00309; G07C 9/00857; H03M 1/808
USPC ................................. 327/142, 143, 198, 538
See application file for complete search history.

(56) References Cited

U.S. PATENT DOCUMENTS

| 5,760,625 A | * | 6/1998 | Macks | G06F 1/305 327/143 |
| 6,005,499 A | | 12/1999 | Shafer | |
| 6,181,255 B1 | * | 1/2001 | Crimmins | G07C 9/00309 340/12.28 |

(Continued)

FOREIGN PATENT DOCUMENTS

| DE | 3312153 A1 | 10/1984 |
| EP | 1006545 A1 | 6/2000 |

(Continued)

OTHER PUBLICATIONS

International Search Report and Written Opinion of the International Searching Authority dated Jun. 2, 2016, for International Application No. PCT/US2016/018491, filed Feb. 18, 2016.

*Primary Examiner* — Lincoln Donovan
*Assistant Examiner* — Colleen O Toole
(74) *Attorney, Agent, or Firm* — Price Heneveld LLP; Bradley D. Johnson

(57) ABSTRACT

A sensing circuit configured to activate a controller is disclosed. The circuit comprises a first transistor configured to output an activation signal to the controller and a plurality of switches in connection with a base of the transistor. Each of the switches is connected to an identifying resistor. A first output node and a second output node are in communication with the base of the transistor and each of the switches. The first output node and the second output node are separated across an additional identifying resistor. The first output node and the second output node are configured to output a characteristic voltage corresponding a ratio of each of the identifying resistors in response to an input received by one or more of the plurality of switches.

20 Claims, 1 Drawing Sheet

(56) References Cited

U.S. PATENT DOCUMENTS

| | | | |
|---|---|---|---|
| 6,504,492 B1 | 1/2003 | Muurinen | |
| 7,248,195 B2 * | 7/2007 | Cordes | H03M 1/808 341/131 |
| 7,486,106 B1 | 2/2009 | Camarota | |
| 2007/0120719 A1 | 5/2007 | Cordes et al. | |

FOREIGN PATENT DOCUMENTS

| | | |
|---|---|---|
| JP | 2003234655 A | 8/2003 |
| RU | 65663 U1 | 8/2007 |

* cited by examiner

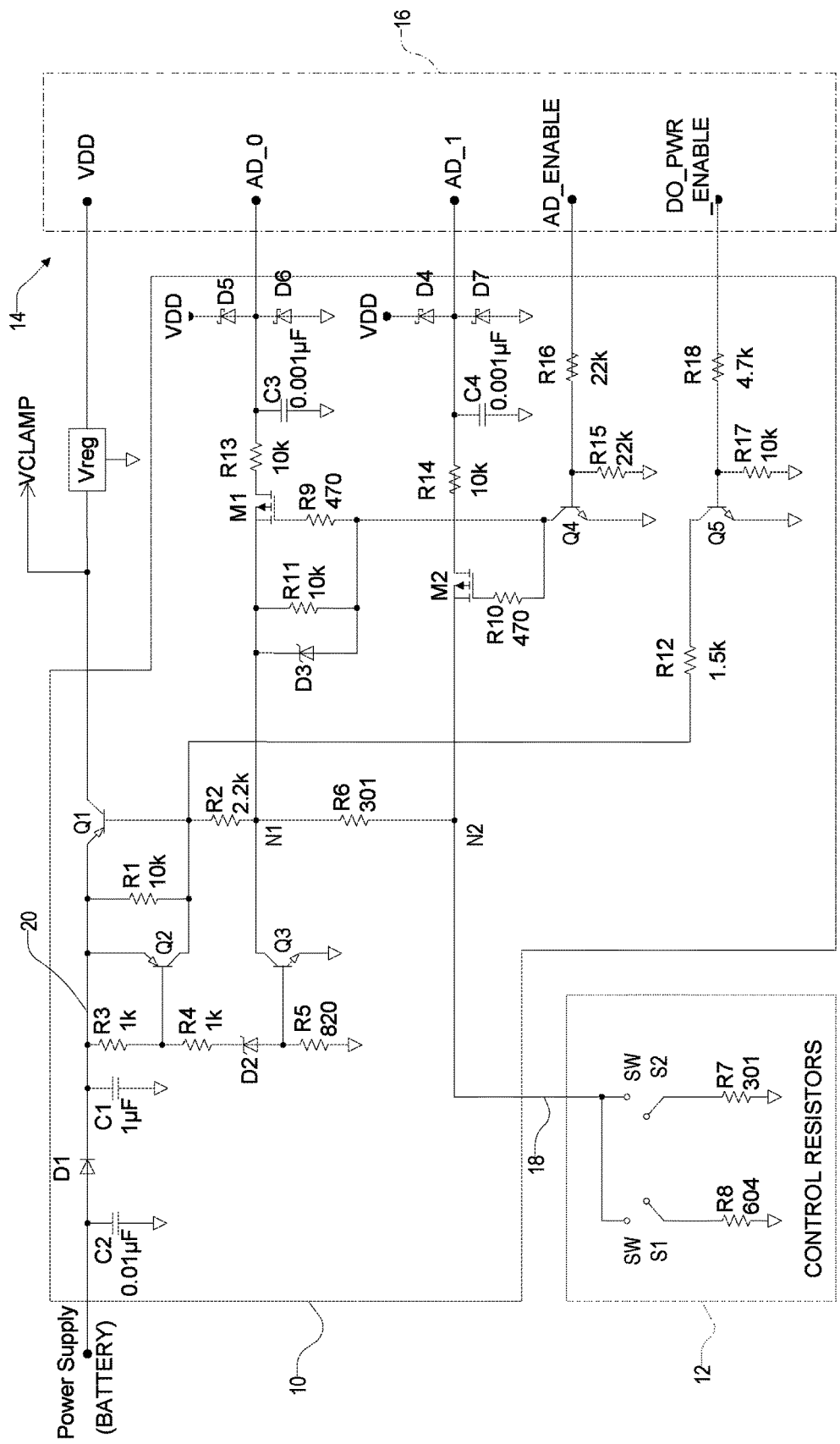

RESISTOR MULTIPLEXED SWITCH WAKE-UP CIRCUIT

BACKGROUND

The disclosure generally relates to a circuit for awakening an electronic device, and more particularly, to a sensory circuit configured to activate an electrical device for use in a vehicle.

SUMMARY

One aspect of the present disclosure provides for a sensing circuit configured to activate a controller. The circuit comprises a first transistor configured to output an activation signal to the controller and a plurality of switches in connection with a base of the transistor. Each of the switches is connected to an identifying resistor. A first output node and a second output node are in communication with the base of the transistor and each of the switches. The first output node and the second output node are separated across an additional identifying resistor. The first output node and the second output node are configured to output a characteristic voltage corresponding a ratio of each of the identifying resistors in response to an input received by one or more of the plurality of switches.

Another aspect of the present disclosure provides for a circuit configured to interface an electrical device and prevent power drainage during a standby mode of operation. The circuit comprises a plurality of switches, each connected to an identifying resistor. The circuit further comprises a transistor comprising a base in connection to each of the switches. The transistor is configured to output an activation signal to the electrical device in response to an input received from at least one of the switches. The circuit also comprises a first output node and a second output node in communication with the base of the transistor and each of the switches. The first output node and the second output node are separated across an additional identifying resistor. The circuit is in communication with a remote switch via a control wire.

Yet another aspect of the present disclosure provides for a circuit configured to interface an electrical device. The circuit comprises a remote switch comprising a first switching device and a second switching device. The first switching device is in communication with a first identifying resistor, and the second switching device is in communication with a second identifying resistor. The circuit further comprises a transistor comprising a base and a third identifying resistor in conductive connection with the first switching device, the second switching device, and the base. The circuit further comprises a first output node and a second output node in communication with the first switching device and the second switching device across the third identifying resistor. The first output node and the second output are in communication with the electrical device.

These and other features, advantages, and objects of the present device will be further understood and appreciated by those skilled in the art upon studying the following specification, claims, and appended drawings.

BRIEF DESCRIPTION OF THE DRAWINGS

FIG. 1 is a schematic diagram of a sensing circuit configured to awaken an electronic device in accordance with the disclosure.

DETAILED DESCRIPTION

For purposes of description herein, the terms "upper," "lower," "right," "left," "rear," "front," "vertical," "horizontal," "clockwise," "counter-clockwise," "interior," "exterior" and derivatives thereof shall relate to the arrangement of the elements introduced in reference to FIG. 1 as viewed by an occupant of the vehicle shown. However, it is to be understood that the various elements of the assemblies illustrated may assume various alternative orientations, except where expressly specified to the contrary. It is also to be understood that the specific devices and processes illustrated in the attached drawings, and described in the following specification are simply exemplary embodiments of the concepts defined in the appended claims. Hence, specific dimensions and other physical characteristics relating to the embodiments disclosed herein are not to be considered as limiting, unless the claims expressly state otherwise.

Referring to FIG. 1, a circuit 10 disclosed herein provides for an interface for an electrical device. Various embodiments of the disclosure may further provide for an interface in the form of the circuit 10 being disposed between the electrical device and a remote switch 12. The circuit 10 may correspond to a sensing circuit configured to limit a number of wires required to interface the electrical device while preventing power drainage into the circuit 10 during temporal periods of a standby mode of the electrical device. In the standby mode, a microcontroller 14 in communication with the circuit 10 via a plurality of input/output (I/O) terminals 16 is idle. As disclosed herein, the circuit 10 is operable to prevent power usage by both the circuit 10 and the microcontroller 14 during the standby mode. The circuit 10 is further operable to activate the microcontroller 14 to sense at least one user input received by the remote switch 12. By maintaining a zero standby current in the standby mode, the sensing circuit 10 provides for an efficient activation of the microcontroller 14 to sense a user input to control the electrical device. The microcontroller 14 may correspond to any form of circuit or controller that may be operable to receive signals from the circuit 10 as described herein.

The circuit 10 provides for an economical and effective design for a user interface configured to receive inputs to activate at least one output or routine of the electrical device. The electrical device may correspond to a wireless transmitter, for example a HOMELINK® trainable wireless transmitter. The electrical device may utilize a transceiver to receive data corresponding to a variety of remote control devices. A remote control device may include a garage door opener control, a remote home security control, a lighting controller, etc. In operation, the electrical device may be operable to receive a control signal and program the signal to control an electronic device. For example, the electrical device may be configured to learn and re-transmit one or more control signals configured to open/close a moving barrier, turn on/off lighting, activate/deactivate a security system, etc.

Examples of electrical devices that may be activated and controlled by the circuit 10 disclosed herein are described in further detail in U.S. Pat. No. 9,819,498, entitled "SYSTEM AND METHOD FOR WIRELESS RE-PROGRAMMING OF MEMORY IN A COMMUNICATION SYSTEM," filed Aug. 21, 2012, by Chris H. Vuyst; and U.S. Pat. No. 8,384,513, entitled "TRANSMITTER AND METHOD FOR TRANSMITTING AN RF CONTROL SIGNAL," filed Jan. 3, 2006, by Todd R. Witkowski, which are included herein by reference in their entirety. It is important to note that the specific components referenced in FIG. 1 including the models, resistances, capacitances, voltages and various additional properties of the specific components shown are intended as examples and should not be considered limiting to the disclosure.

As discussed herein, the remote switch 12 may comprise two or more buttons or inputs corresponding to a user interface of the electrical device. As shown in FIG. 1, a first switch S1 and a second switch S2 are configured to control the electrical device. In relation to the particular embodiment corresponding to the HOMELINK® trainable wireless transmitter, a single button press (e.g. depressing the first switch S1) may control the transmitter to emit control signals configured to open doors or control other devices. Additionally, multiple button presses (e.g. depressing switches S1 and S2) may be utilized for additional functions, such as entering training modes. Each of the inputs of the remote switch 12 is multiplexed on a control wire 18 corresponding to a single wire. The single wire interface between the circuit 10 and the switch 12 may provide for the switch 12 to be located away from the circuit 10 while allowing for the circuit 10 to receive signals efficiently through the control wire 18.

The inputs of the remote switch 12 are encoded by providing a unique resistance value for each switch closure (e.g the switches S1 and S2). If a combination of the switches S1 and S2 are pressed simultaneously, an equivalent parallel resistance will be sensed. In this configuration, the circuit 10 is operable to output control signals having unique resistances in order to control the electrical device via the I/O terminals 16. The circuit 10 disclosed herein may differ from other circuits in that the unique architecture provides for approximately zero current draw in the idle mode while providing for a wakeup signal configured to activate a microcontroller 14 to sense a user input to control the electrical device.

Still referring to FIG. 1, the circuit 10 is described in further detail to present various benefits and variations of the novel architecture disclosed herein. In the illustrated embodiment, the circuit 10 is supplied power from a power supply in the form of a BATTERY. A first capacitor C1 and a second capacitor C2 provide radio frequency (RF) and electro-magnetic interference (EMI) protection as well as protection from transient spikes that may damage or cause improper operation of the circuit 10. The capacitors C1 and C2 are in connection with a battery line 20 conductively connected to the BATTERY. A first diode D1 provides reverse polarity protection on the battery line 20.

A first transistor Q1 provides a switched and over-voltage protected output on a activation line VCLAMP in communication with the microcontroller 14. The first transistor Q1 is normally off, resulting in a nominal zero standby current. As is generally known, a transistor, such as the first transistor Q1, may comprise three terminals: a base, a collector, and an emitter. The switches S1 and S2 are used to supply user inputs to the microcontroller 14. Resistors R8 and R7 are connected in series with switches S1 and S2 respectively. When any or all of the switches are closed, the first transistor Q1 is activated such that current flows from the battery through the first diode D1, each of the resistors R2 and R6, the closed switch and its associated resistor (e.g. R7 or R8). The activation of the first transistor Q1 provides protected battery power to the activation line VCLAMP, which powers the voltage regulator Vreg that supplies power to the microcontroller 14.

The first resistor R1 is used to prevent unwanted activation of the first transistor Q1 due to potential leakage currents from the user input switches S1 and S2. The second resistor R2 limits a base current of the first transistor Q1. The sixth resistor R6 is used to provide for current sensing by the microcontroller 14 in response to user inputs into the switches S1 and S2. In this configuration, the microcontroller 14 is operable to identify an input into the switches corresponding to the first switch S1, the second switch S2, or a combination of the switches. The microcontroller 14 may sense a voltage or current corresponding to a first output node N1 and a second output node N2. The first output node N1 is in communication with the controller 14 via a first analog to digital (A/D) input AD_0 across a thirteenth resistor R13, and the second output node N2 is in communication with the controller 14 via a second A/D input AD_1 across a fourteenth resistor R14.

The microcontroller 14 may receive an activation signal and be powered from a voltage regulator Vreg powered by the activation line VCLAMP. The microcontroller 14 boots up in response to the current received from the battery line 20 through the first transistor Q1. The microcontroller 14 is operable to determine the states of the switches S1 and S2 using the first A/D input AD_0 and the second A/D input AD_1 of the I/O terminals 16. The A/D inputs AD_0 and AD_1 may be output from the circuit 10 to supply voltage to an A/D converter of the microcontroller 14. The voltage supplied to the A/D converter corresponds to the unique resistance value for each of the switches S1 and S2. In this configuration, the circuit 10 is operable to output control signals corresponding to the unique resistances to identify an input to one or more of the switches S1 and S2, and the microcontroller 14 is operable to identify the control signals received at the A/D converters AD_0 and AD_1.

The circuit 10 may comprise a plurality of metal-oxide-semiconductor field-effect transistors (MOSFETs). A first MOSFET M1 and a second MOSFET M2 are configured to be normally off to prevent standby power drain or activation of Q1 due to current flow into the A/D converter inputs of the unpowered microcontroller 14. As is generally known, a MOSFET, such as the first MOSFET M1, may comprise three terminals: a source, a gate, and a drain. The gate and source voltages of the first MOSFET M1 and the second MOSFET M2 are equal as long as a fourth transistor Q4 is off or inactive. An eleventh resistor R11 pulls both gates to the source voltage of each of the MOSFETs M1 and M2. A third diode D3 may correspond to a Zener diode used to prevent excessive gate voltage from being applied to the MOSFETs M1 and M2. Gate resistors R9 and R10 are used to protect the MOSFETs M1 and M2 against unwanted activation due to RF energy.

Once the microcontroller 14 is operational it can turn on the MOSFETS M1 and M2 by bringing a signal to an A/D enable input AD_ENABLE of the circuit 10 to a high signal. Upon receiving the high signal, the MOSFETs M1 and M2 are configured to allow current to flow through a sixteenth resistor R16 and into a base of a fourth transistor Q4. The current flow at the base of the fourth transistor Q4 activates the gates of the MOSFETs M1 and M2 by pulling down the gate voltages and thereby allowing current to pass through the MOSFETs M1 and M2 to activate the A/D inputs AD_0 and AD_1. R15 may be optionally used to prevent unwanted operation of the fourth transistor Q4 due to small offset voltages that may be supplied to the circuit 10 from the AD_ENABLE line of the microcontroller 14.

Once the MOSFETs M1 and M2 are turned on, the microcontroller 14 can measure the voltages on the A/D inputs AD_0 and AD_1. If a switch S1 or S2 that has been previously activated is released, or the contacts of either switch S1 or S2 bounce while the MOSFETs M1 and M2 are turned on, approximately the full voltage of the of the power supply BATTERY will be applied to the drains of the MOSFETs M1 and M2. The microcontroller 14 may be operable to sense the full voltage from power supply VDD to verify that the A/D inputs AD0 and AD1 are stable. That is, in order to ensure that an input or switch press into one of the switches S1 and S2 is valid, the microcontroller 14 is operable to verify that the signal supplied to the A/D inputs AD_0 and AD_1 are at a stable level less than the supply voltage for a predetermined period of time.

In various implementations supported by this disclosure, various diodes, resistors, capacitors and other electrical components may be integrated in the circuit 10 and/or the microcontroller 14. Such components may provide for signal conditioning, voltage protection, reverse-polarity protection, RF and EMI protection, etc. In this regard, the thirteenth resistor R13, the fourteenth resistor R14, and diodes D4-D7 are configured to protect the A/D inputs of the microcontroller 14 from over-voltage. Diodes D4-D7 may or may not be incorporated into the microcontroller 14. Capacitors C3 and C4 are noise filters configured to ensure stable A/D readings by the microcontroller 14. It is important to note that the specific components referenced in FIG. 1 including the models, resistances, capacitances, voltages and various additional properties of the specific components shown are intended as examples and should not be considered limiting to the disclosure.

Once a valid input to at least one of the switches S1 and S2 is detected, the resistance of the switch can be determined because the voltage drop across a known resistance R6 is proportional to the current through R6. Using Ohms Law, the microcontroller 14 is operable to determine the resistance corresponding to an input into the first switch S1, the second switch S2, and a combination of the switches S1 and S2 as a switch resistance. The switch resistance may be calculated by dividing the voltage on second A/D input AD_1 by the current through the sixth resistor R6. Additionally, the ratio of the voltage difference between the voltage supplied to the first A/D input AD_0 and the second A/D input AD_1 can be compared to the voltage at second A/D input AD_1.

The aforementioned comparisons may be utilized to determine the switch resistance and the corresponding input to one or more of the switches S1 and/or S2 due to the resistors R6, R7, and R8 having a predetermined relationship. The resistors R6, R7, and R8 may be referred to herein as identifying resistors. The identifying resistors R6, R7, and R8 may be termed such because the relationship of their resistance is utilized by the microcontroller 14 to identify which of the one or more switches S1 and S2 has received an input.

The following example illustrates an exemplary embodiment of the microcontroller 14 identifying an input received by the first switch S1, the second switch S2, or both switches S1 and S2. In the following example, the resistance of the sixth resistor R6 is approximately equal to the resistance of the seventh resistor (R6≈R7), and the resistance of the eighth resistor R8 is approximately equal to twice the resistance of the sixth resistor (R8≈2*R6). In this configuration, the following relationships exist:

if the second switch S2 is closed, the voltage at the second A/D input AD_1 will be approximately equal to the voltage difference between the first A/D input AD_0 and the second A/D input AD_1;

if the first switch S1 is closed, the voltage at the second A/D input AD_1 will be approximately equal to twice the voltage difference between the first A/D input AD_0 and the second A/D input AD_1; and if both switches S1 and S2 are closed, the voltage at the second A/D input AD_1 will be approximately equal to 0.4 times the voltage difference between the first A/D input AD_0 and the second A/D input AD_1.

These relationships are substantially independent of the supply voltage.

Though specific examples describing two switches S1 and S2 are described in detail herein, it may be understood that additional switches and resistors may be added in parallel with the first switch S1 to provide additional user inputs without adding interface wires in addition to the control wire 18. As such, the disclosure provides for a circuit operable to receive a plurality of inputs from remote switches. The circuit 14 is operable to deliver signals that not only activate a microcontroller, but also may be used to identify a switch resistance corresponding to one or more inputs being received by a remote switch. The circuit may also be used for a single switch if it is necessary to distinguish a grounded switch line from a valid button press.

Once a valid input to at least one of the switches S1 and S2 is detected, the microcontroller 14 may activate a power enable input DO_PWR_ENABLE to the circuit 10 to high. The power enable input DO_PWR_ENABLE may provide for the base current to pass through an eighteenth resistor R18 to turn on a fifth transistor Q5. A seventeenth resistor R17 is optionally used to prevent unwanted operation of the fifth transistor Q5 due to small offset voltages on the power enable input DO_PWR_ENABLE. The base current from the first transistor Q1 will flow through a twelfth resistor R12 and the fifth transistor Q5 allowing the microcontroller 14 to keep the first transistor Q1 turned on even if the one or more switches S1 and/or S2 is released. In this way, the controller is operable to hold the activation line VCLAMP for a predetermined period of time to provide for operation of the microcontroller 14 and associated circuitry for a variety of applications.

The second transistor Q2 is used to switch off or deactivate the activation line VCLAMP if excessive voltage is present on the power supply BATTERY. A second diode D2, which may correspond to a Zener diode, will begin to conduct at a predetermined voltage. The voltage conducted through the second diode may cause a current limited by R4 to flow through the base of Q2. In response to receiving the current at its base, the second transistor Q2 may activate shunting current around an emitter-base junction of the first transistor Q1. The shunting current around the emitter-base junction of the first transistor Q1 may result in turning the first transistor Q1 off, and thus, protecting the load (e.g. the voltage regulator Vreg and the microcontroller 14) on the activation line VCLAMP from excessive voltage on the battery line 20.

The third transistor Q3 may be optionally utilized to allow the use of low voltage transistors at MOSFETs M1 and M2. If the third transistor Q3 is not used, the fifth resistor R5 may optionally be replaced by a short. The third resistor R3 is used to ensure that the second transistor Q2 is not activated by leakage current through the second diode D2 and to ensure that the second transistor Q2 only activates for over-voltage events. The third resistor R3 and the fifth resistor R5 can have a predetermined resistance value relationship. In operation, the second transistor Q2 may turn on slightly before the third transistor Q3 in order to ensure that the microcontroller 14 is never turned on with A/D inputs AD_0 and AD_1 held low. To ensure that the second transistor Q2 turns on slightly before the third transistor Q3, the fifth resistor R5 may be selected to have a lower resistance than the third resistor R3.

For purposes of this disclosure, the term "coupled" (in all of its forms, couple, coupling, coupled, etc.) generally means the joining of two components (electrical or mechanical) directly or indirectly to one another. Such joining may be stationary in nature or movable in nature. Such joining may be achieved with the two components (electrical or mechanical) and any additional intermediate members being integrally formed as a single unitary body with one another or with the two components. Such joining may be permanent in nature or may be removable or releasable in nature unless otherwise stated.

It is also important to note that the construction and arrangement of the elements of the disclosure as shown in the exemplary embodiments is illustrative only. Although only a few embodiments of the present innovations have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts or elements shown as multiple parts may be integrally formed, the operation of the interfaces may be reversed or otherwise varied, the length or width of the structures and/or members or connector or other elements of the system may be varied, the nature or number of adjustment positions provided between the elements may be varied. It should be noted that the elements and/or assemblies of the system may be constructed from any of a wide variety of materials that provide sufficient strength or durability, in any of a wide variety of colors, textures, and combinations. Accordingly, all such modifications are intended to be included within the scope of the present innovations. Other substitutions, modifications, changes, and omissions may be made in the design, operating conditions, and arrangement of the desired and other exemplary embodiments without departing from the spirit of the present innovations.

It will be understood that any described processes or steps within described processes may be combined with other disclosed processes or steps to form structures within the scope of the present disclosure. The exemplary structures and processes disclosed herein are for illustrative purposes and are not to be construed as limiting.

It is also to be understood that variations and modifications can be made on the aforementioned structure without departing from the concepts of the present disclosure, and further it is to be understood that such concepts are intended to be covered by the following claims unless these claims by their language expressly state otherwise.

What is claimed is:

1. A sensing circuit configured to activate a controller comprising:
    a first transistor configured to output an activation signal to the controller;
    a plurality of switches configured to receive a user input in connection with a base of the transistor, each of the switches being connected to an identifying resistor; and
    a first output node and a second output node in communication with the base of the transistor and each of the switches, the first output node and the second output node separated across an additional identifying resistor; wherein the first output node and the second output node are configured to output a characteristic voltage corresponding to a ratio of each of the identifying resistors in response to a user input received by each of the plurality of switches, wherein the characteristic voltage comprises a different voltage controlled in response to the user input received by each of the plurality of switches.

2. The sensing circuit according to claim 1, wherein the first transistor is configured to prevent current drain from a power supply in connection with an emitter of the first transistor.

3. The sensing circuit according to claim 2, wherein the power supply is configured to supply the activation signal in response to the input received by one or more of the plurality of switches.

4. The sensing circuit according to claim 1, wherein a plurality of switches comprises a first switch and a second switch.

5. The sensing circuit according to claim 4, wherein the first switch is connected to a first identifying resistor and the second switch is connected to a second identifying resistor.

6. The sensing circuit according to claim 5, wherein the additional identifying resistor corresponds to a third identifying resistor.

7. The sensing circuit according to claim 6, wherein first output node and the second output node are configured to output the characteristic voltage corresponding a ratio of a resistance of at least two of the first identifying resistor, the second identifying resistor, and the third identifying resistor.

8. A circuit configured to interface an electrical device and prevent power drainage during a standby mode of operation, the circuit comprising:
    a plurality of switches, each of the switches configured to receive a user input and being connected to an identifying resistor;
    a transistor comprising a base in connection to each of the switches, the transistor configured to output an activation signal to the electrical device in response to an input received from at least one of the switches; and
    a first output node and a second output node in communication with the base of the transistor and each of the switches, the first output node and the second output node separated across an additional identifying resistor, wherein the switches are configured to control a voltage difference between the first output node and the second output node, wherein each of the plurality of switches is configured to communicate a unique control Signal via a control wire in response to the user input.

9. The circuit according to claim 8, wherein the plurality of switches correspond to a first switching devices and a second switching device.

10. The circuit according to claim 9, wherein each of the switches is configured to communicate the unique control signal via the control wire corresponding to a first identifying resistance of the first switching device and a second identifying resistance of the second switching device.

11. The circuit according to claim 9, wherein each of the switches is configured to communicate the unique control signal as a different voltage via the control wire in response to an input to each of the first switching device, the second switching device, and an input to both the first switching device and the second switching device.

12. The circuit according to claim 8, wherein the plurality of switches corresponds to a user interface having a plurality of input buttons.

13. The circuit according to claim 8, wherein the electrical device corresponds to a device comprising a transmitter configured to control a remote electronic device.

14. A circuit configured to interface an electrical device comprising:
   a remote switch comprising:
      a first switching device in communication with a first identifying resistor; and
      a second switching device in communication with a second identifying resistor;
   a transistor comprising a base;
   a third identifying resistor in conductive connection with the first switching device, the second switching device, and the base;
   and
   a first output node and a second output node in communication with the first switching device and the second switching device across the third identifying resistor, wherein the first output node and the second output are in communication with the electrical device, wherein each of the first output node and the second output node are configured to communicate a different identifying voltage to the electrical device in response to a user input received by each of the switching devices.

15. The circuit according to claim 14, wherein the first output node and the second output node are configured to communicate a control signal to the electrical device in response to an input to the remote switch.

16. The circuit according to claim 14, wherein the first switching device and the second switching device are in communication with the third identifying resistor via a control wire.

17. The circuit according to claim 16, wherein the remote switch is configured to communicate a plurality of unique control signals via the control wire corresponding to a first identifying resistance of the first switching device and a second identifying resistance of the second switching device.

18. The circuit according to claim 8, wherein the voltage difference corresponds to a characteristic voltage output to a controller configured to distinguish an input from each of the switches based on the characteristic voltage.

19. The circuit according to claim 14, wherein the electrical device is configured to distinguish an input received from each of the switching devices based on a voltage difference between the first output node and the second output node.

20. The circuit according to claim 1, wherein the user input received by each of the plurality of switches comprises a first user input received by a first switch of the plurality of switches and a second user input received by a second switch of the plurality of switches.

* * * * *

UNITED STATES PATENT AND TRADEMARK OFFICE
CERTIFICATE OF CORRECTION

PATENT NO. : 9,954,518 B2  
APPLICATION NO. : 15/046982  
DATED : April 24, 2018  
INVENTOR(S) : Robert R. Turnbull Page 1 of 1

It is certified that error appears in the above-identified patent and that said Letters Patent is hereby corrected as shown below:

Column 8, Claim 8, Line 47:
"Signal" should be -- signal --

Signed and Sealed this
Fourth Day of September, 2018

Andrei Iancu
*Director of the United States Patent and Trademark Office*